(12) United States Patent
Sun

(10) Patent No.: US 7,619,446 B2
(45) Date of Patent: Nov. 17, 2009

(54) COMPARATOR WITH REDUCED POWER CONSUMPTION AND METHOD FOR THE SAME

(75) Inventor: Tao Sun, Beijing (CN)

(73) Assignee: Vimicro Corporation, Beijing (CN)

( * ) Notice: Subject to any disclaimer, the term of this patent is extended or adjusted under 35 U.S.C. 154(b) by 89 days.

(21) Appl. No.: 11/955,199

(22) Filed: Dec. 12, 2007

(65) Prior Publication Data

US 2008/0136461 A1  Jun. 12, 2008

(30) Foreign Application Priority Data

Dec. 12, 2006  (CN)  ......................... 2006 1 0167244

(51) Int. Cl.
*G11C 27/02* (2006.01)
*H03K 5/00* (2006.01)
*H03K 17/00* (2006.01)

(52) U.S. Cl. ......................................... 327/97; 327/50

(58) Field of Classification Search .............. 327/50–97
See application file for complete search history.

(56) References Cited

U.S. PATENT DOCUMENTS 7,113,016 B2 * 9/2006 Hsieh et al. .................. 327/307
2003/0179028 A1 * 9/2003 Kizer et al. .................. 327/158

* cited by examiner

*Primary Examiner*—Lincoln Donovan
*Assistant Examiner*—Diana J Cheng
(74) *Attorney, Agent, or Firm*—Joe Zheng; Wuxi Sino-US IP Agency, Ltd.

(57) ABSTRACT

Techniques pertaining to a comparator circuit with reduced power consumption are disclosed. According to one aspect of the present invention, the comparator unit has a pair of input signal pins VIP and VIN, a pair of output signal pins VOR and VOS, and a clock signal pin CLK. In operation, when the CLK signal is at an idle voltage level, the comparator unit comes into an idle state. At the idle state, the comparator unit does not compare the two input signals VIP and VIN so that the output signals are identical. When the CLK signal is at a busy voltage level, the comparator comes into a busy state. At the busy state, the comparator compares the input signals VIP and VIN, and determines the values of the output signals VOR and VOS depending on the comparing result, e.g., if the input signal VIP is larger than the input signal VIN, the output signal VOR is high and the output signal VOS is low; otherwise, the output signal VOR is low and the output signal VOS is high.

7 Claims, 4 Drawing Sheets

COMPARATOR WITH REDUCED POWER CONSUMPTION AND METHOD FOR THE SAME

BACKGROUND OF THE INVENTION

1. Field of the Invention

The present invention relates to the techniques for integrated circuit design, and more particularly to a comparator with reduced power consumption and a method for reducing power consumption of a comparator.

2. Description of Related Art

As well known, various comparator circuits are utilized in integrated circuit devices (IC) for different purposes. For example, in a switched-capacitor circuit which is able to achieve a variety of functions by depositing and transferring charges in a capacitor, a comparator circuit includes a switch circuit controlled by a clock signal is introduced to determine the state of an input voltage signal by comparing the input voltage signal against a reference voltage signal. For eliminating the noise introduced by clock crossed-interference and remaining voltage from switching on/off of the MOS transistors, the comparator circuit is provided with a differential amplifier to amplify the difference between the input voltage signal and the reference voltage signal.

FIG. 1 is a schematic block diagram illustrating a conventional high definition comparator in a switched capacitor circuit. As shown in FIG. 1, the comparator has a pair of input signal pins VIP and VIN, a positive output signal pin VOR, a negative output signal pin VOS, a low voltage level signal pin VL, a sub-low voltage level signal pin VLSUB, a high voltage level signal pin VH and a clock signal pin CLK. In operation, when the CLK signal is at a low voltage level (shortened as "L" hereafter), the comparator comes into an idle state. In the idle state, the comparator does not compare the input signal VIP with the input signal VIN so that the output signal VOR is identical to the output signal VOS, e.g., both of the output signals VOR and VOS are L. At this state, there is almost no power consumption in the comparator. When the CLK signal is high voltage level (shortened as "H" hereafter), the comparator comes into a busy state. In the busy state, the comparator compares the input signal VIP with the input signal VIN and determines the values of the output signals VOR and VOS depending on the comparing result, e.g., if the input signal VIP is larger than the input signal VIN, the output signal VOR is H and the output signal VOS is L; otherwise, the output signal VOR is L and the output signal VOS is H.

Although the comparing result is already obtained, as long as the CLK signal still is H, the comparator may keep comparing the input signals VIP and VIN all the time. As a result, the comparator may also consume a great deal of energy.

Thus, improved techniques for providing a comparator with reduced power consumption are desired to overcome the above disadvantages.

SUMMARY OF THE INVENTION

This section is for the purpose of summarizing some aspects of the present invention and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present invention.

In general, the present invention pertains to a comparator circuit with reduced power consumption. According to one aspect of the present invention, the comparator unit has a pair of input signal pins VIP and VIN, a pair of output signal pins VOR and VOS, and a clock signal pin CLK. In operation, when the CLK signal is at an idle voltage level, the comparator unit comes into an idle state. At the idle state, the comparator unit does not compare the two input signals VIP and VIN so that the output signals are identical. When the CLK signal is at a busy voltage level, the comparator comes into a busy state. At the busy state, the comparator compares the input signals VIP and VIN, and determines the values of the output signals VOR and VOS depending on the comparing result, e.g., if the input signal VIP is larger than the input signal VIN, the output signal VOR is high and the output signal VOS is low; otherwise, the output signal VOR is low and the output signal VOS is high.

The present invention may be implemented as a method, a circuit and a part of system. According to one embodiment, the present invention is a method for reducing power consumption of a comparator, the method comprises: comparing a pair of input signals of a comparator unit to generate a pair of output signals thereof when the comparator unit is in a busy state; latching values of the output signals; and turning the comparator unit into an idle state to reduce power consumption when the pair of output signals are different.

According to another embodiment, the present invention is a comparator unit with reduced power consumption, the comparator unit configured to compare a pair of input signals thereof to generate a pair of output signals under a control of a clock signal, the generated output signals being identical when the clock signal is an idle voltage level and the generated output signals being different when the clock signal is a busy voltage level. The comparator comprises a detecting unit configured to detect whether the output signals of the comparator are identical, if yes, the detecting unit outputs the idle voltage level as a detecting signal, otherwise, the detecting unit outputs the busy voltage level as the detecting signal; a triggering unit configured to generate a triggering signal depending on the detecting signal and an original clock signal for controlling the comparator, the triggering unit generating the idle voltage level as the triggering signal as long as the original clock signal is the idle voltage level, the triggering signal remaining an original state thereof when the detecting signal is the idle voltage level and the original clock signal is the busy voltage level, and the triggering signal turning to an opposite state thereof when the detecting signal is the busy voltage level and the original clock signal is the busy voltage level; and a determining unit configured for generating the clock signal for the comparator depending on the triggering signal and the original clock signal, the determining unit generating the busy voltage level as the clock signal when the triggering signal is different from the original clock signal and generating the idle voltage level as the clock signal when the triggering signal is identical with the original clock signal.

One of the features, benefits and advantages in the present invention is to provide techniques for reducing power consumption of a comparator circuit.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

The detailed description of the present invention is presented largely in terms of procedures, steps, logic blocks, processing, or other symbolic representations that directly or indirectly resemble the operations of devices or systems contemplated in the present invention. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or the use of sequence numbers representing one or more embodiments of the invention do not inherently indicate any particular order nor imply any limitations in the invention.

Figure 2:
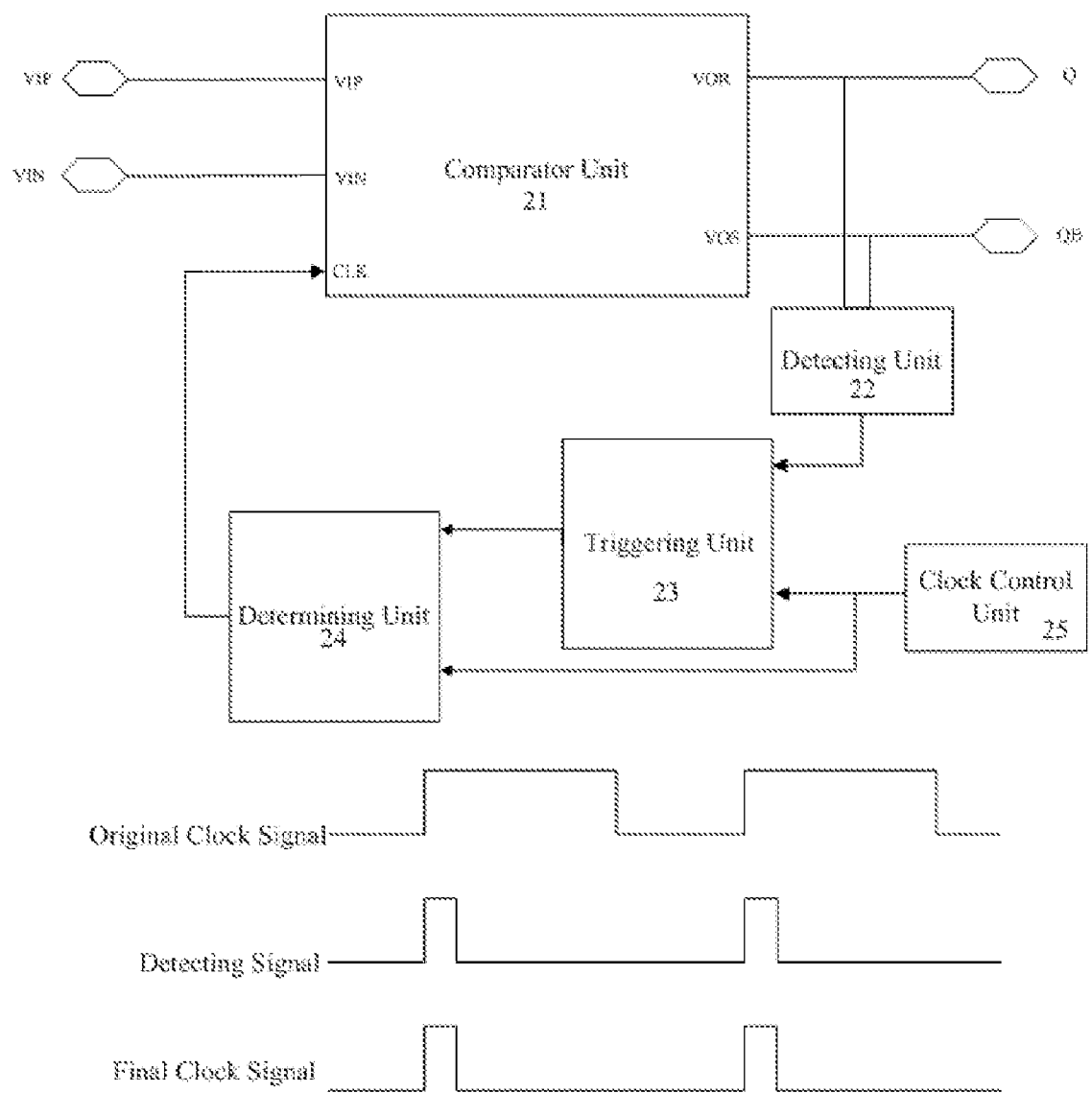
FIG. 2 is a schematic block diagram showing a comparator with reduced power consumption according to one embodiment of the present invention.
Figure 3:
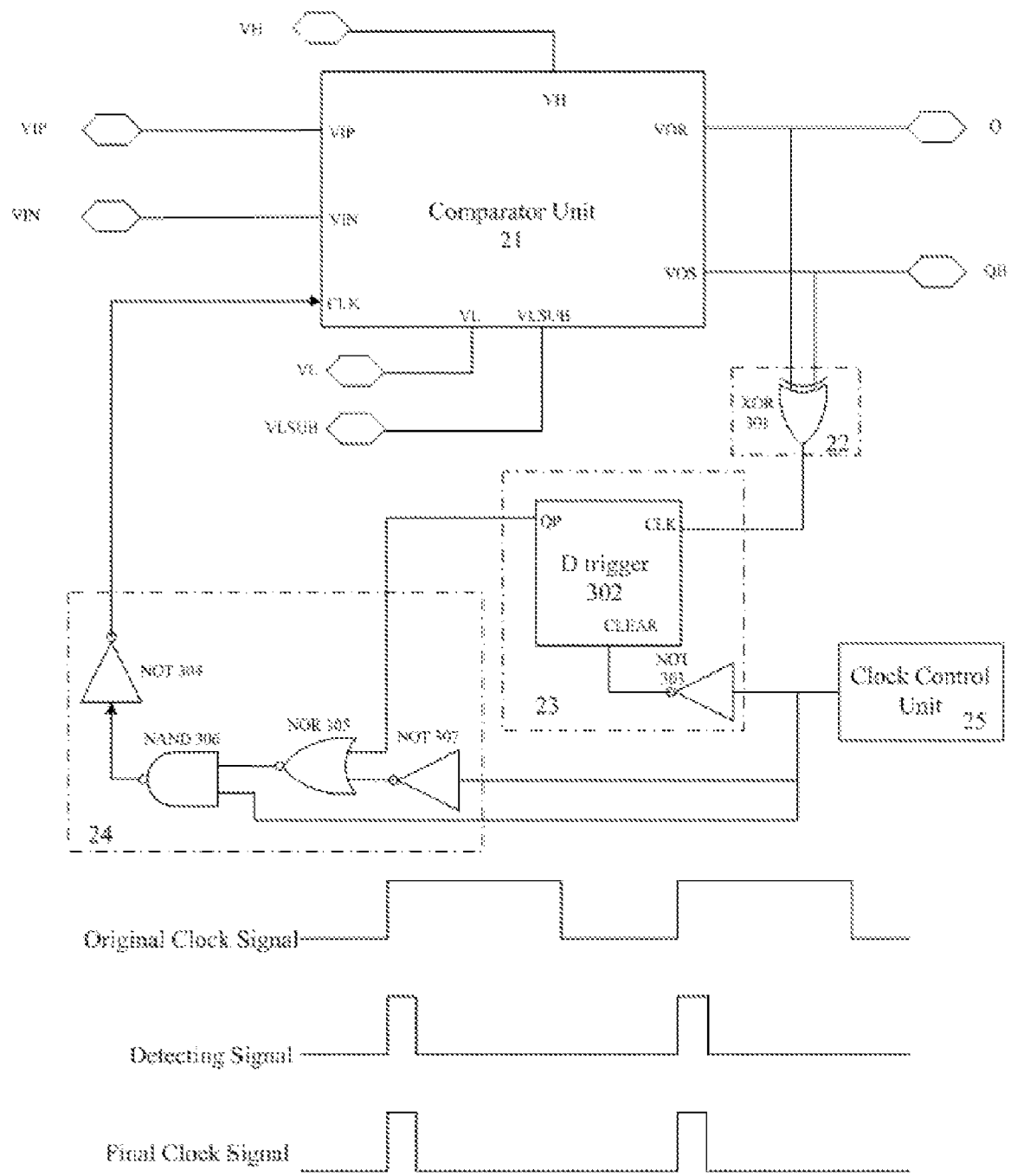
FIG. 3 is a schematic exemplary configuration illustrating the comparator with reduced power consumption according to one preferred embodiment of the present invention.
Figure 4:
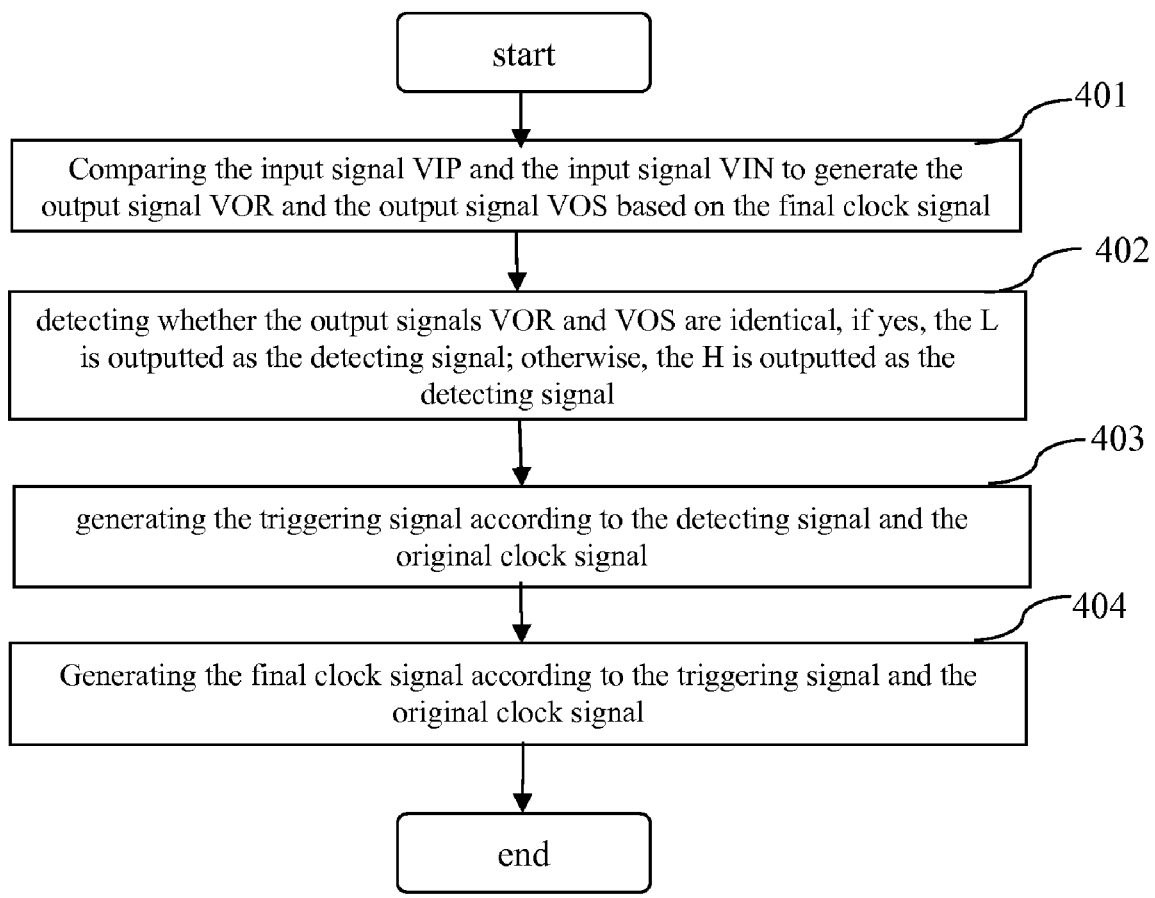
FIG. 4 is a schematic flowchart showing a method for reducing power consumption of the comparator according to one embodiment of the present invention.

Embodiments of the present invention are discussed herein with reference to FIGS. 2-4. However, those skilled in the art will readily appreciate that the detailed description given herein with respect to these figures is for explanatory purposes only as the invention extends beyond these limited embodiments.

In general, power consumption of a comparator according to one embodiment of the present invention can be reduced by detecting a first output signal and a second output signal of the comparator and setting the comparator to an idle state when the first output signal is detected different from the second output signal.

FIG. 2 is a schematic block diagram showing a comparator with reduced power consumption according to one embodiment of the present invention. The comparator comprises a comparator unit 21, a detecting unit 22, a triggering unit 23, a determining unit 24 and a clock control unit 25.

Figure 1:
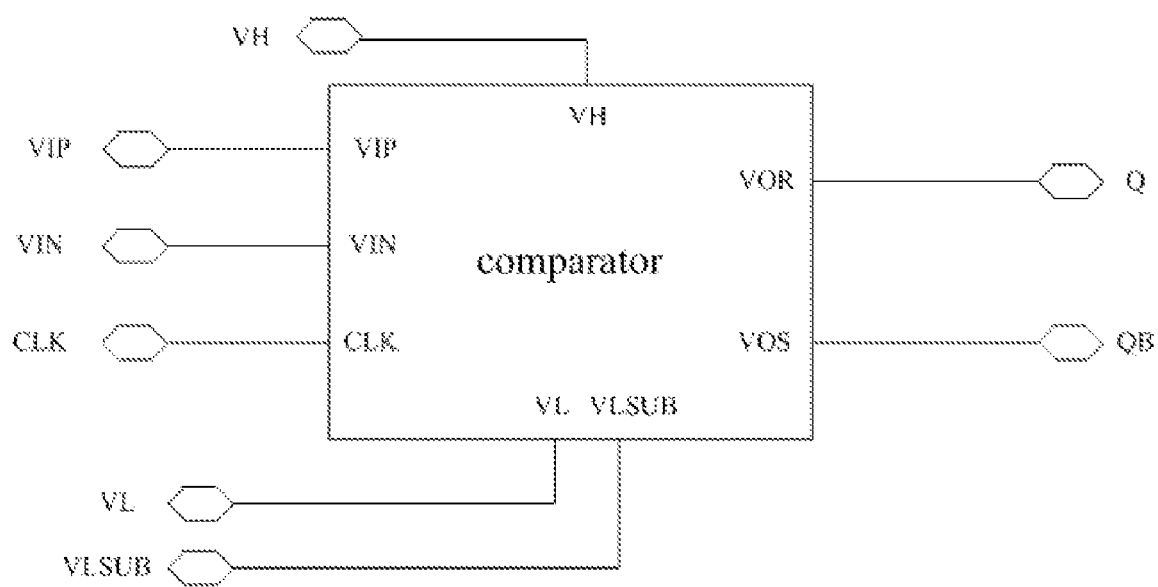
FIG. 1 is a schematic block diagram illustrating a conventional high definition comparator in a switched-capacitor circuit.

Similar to the comparator shown in FIG. 1, the comparator unit 21 has a pair of input signal pins VIP and VIN, a positive output signal pin VOR, a negative output signal pin VOS and a clock signal pin CLK. In operation, when the CLK signal is at an idle voltage level, such as a low voltage level (shorten as "L" hereafter), the comparator unit 21 comes into an idle state. At the idle state, the comparator unit 21 does not compare the input signal VIP with the input signal VIN so that the output signal VOR is identical to the output signal VOS. When the CLK signal is at a busy voltage level such as a high voltage level (shorten as "H" hereafter), the comparator comes into a busy state. At the busy state, the comparator compares the input signal VIP with the input signal VIN and determines the values of the output signals VOR and VOS depending on the comparing result, e.g., if the input signal VIP is larger than the input signal VIN, the output signal VOR is H and the output signal VOS is L; otherwise, the output signal VOR is L and the output signal VOS is H.

The clock control unit 25 is configured to generate an original clock signal. The detecting unit 22 is configured to detect whether the output signal VOR is identical to the output signal VOS and output a detecting signal based on the detecting result. In operation, if the output signal VOR is identical to the output signal VOS, the detecting unit 22 outputs an idle voltage level as the detecting signal, otherwise, the detecting unit 22 outputs a busy voltage level as the detecting signal. The triggering unit 23 is designed to receive the detecting signal and the original clock signal to generate a triggering signal depending on the detecting signal and the original clock signal. The determining unit 24 is designed to receive the triggering signal and the original clock signal to generate a final clock signal for the comparator unit 21.

When the original clock signal from the clock control unit 25 is the idle voltage level, the triggering unit 23 is cleared to output the idle voltage level as the triggering signal. At this time, both of the two input signals of the determining unit 24 are the idle voltage level, so the final clock signal from the determining unit 24 is the idle voltage level, thereby the comparator unit 21 comes into the idle state and outputs the identical voltage levels as the output signal VOR and the output signal VOS respectively. Due to the output signal VOR is identical to the output signal VOS, the detecting unit 22 outputs the idle voltage level to the triggering unit 23. The trigger unit 23 keeps an original state to output the idle voltage level signal. As a result, the comparator unit 21 may keep the idle state by cycling above operations as long as the original clock signal is the idle voltage level.

When the original clock signal from the clock control unit 25 is the busy voltage level, the detecting unit 22 still outputs the idle voltage level as the detecting signal, and the triggering signal from the triggering unit 23 remains the idle voltage level at first. At this time, both of the two input signals of the determining unit 24 are different, the final clock signal from the determining unit 24 becomes a busy voltage level, thereby the comparator unit 21 turns into the busy state and outputs the different voltage levels as the output signal VOR and the output signal VOS, respectively. When the output signal VOR is identical to the output signal VOS, the detecting unit 22 outputs the busy voltage level as the detecting signal to the triggering unit 23. The trigger unit 23 turns to output the busy voltage level signal. Thus, the two input signals of the determining unit 24 becomes identical again, the final clock signal from the determining unit 24 becomes the idle voltage level so that the comparator unit 21 returns into the idle state and outputs the identical voltage levels again. Hence, the detecting unit 22 outputs the idle voltage level signal to the triggering unit 23 so that the triggering unit 23 keeps the original state to output the busy voltage level signal. As a result, the comparator unit 21 may keep the idle state by cycling above operations until another busy voltage level comes in.

FIG. 3 is an exemplary schematic block diagram illustrating the comparator with reduced power consumption according to one preferred embodiment of the present invention. The comparator comprises the comparator unit 21, the detecting unit 22, the triggering unit 23, the determining unit 24 and the clock control unit 25.

Depending on implement, the detecting unit 22 may be an exclusive OR (XOR) gate 301 or other logic circuit having same function. The triggering unit 23 comprises a D trigger 302 and a NOT gate 303. The NOT gate 303 is configured for receiving the original clock signal, making a NOT operation to the original clock signal and outputting an operation result to the D trigger 302. The D trigger 302 comprises an output terminal QP, a clock signal terminal for electrically connecting with an output terminal of the XOR gate 301 and a clearing terminal for electrically connecting with an output terminal of the NOT gate 303. The clearing terminal receives the operation result of the XOR gate 301, and the clock signal terminal receives the detecting signal from the detecting unit 22, and the triggering signal is outputted to the determining unit 24 via the output terminal QP. The D trigger 302 may be modified into other logic circuits having triggering and retaining functions such as R-J trigger etc.

The determining unit 24 comprises a pair of NOT gates 304 and 307, a NOR gate 305 and a NAND gate 306. The NOT gate 307 is configured for receiving the original clock signal, making a NOT operation to the original clock signal and outputting an operation result to one input terminal of the NOR gate 305. The NOR gate 305 is configured for receiving the operation result from the NOR gate 307 and the triggering signal from the D trigger 302 and outputting an operation result after NOR operation. The NAND gate 306 is configured for receiving the operation result from the NOR gate 305 and the original clock signal from the clock control unit 25 and outputting an operation result after NAND operation. The NOT gate 304 is configured for receiving the operation result from the NAND gate 306 and outputting an operation result after NOT operation. There may be a lot of modifications to the determining unit 24 in other cases. In one case, the NOT gate 304 and the NAND gate 306 may be combined into one AND gate. In another case, the NOT gate 307 and the NOT gate 303 may be combined into one NOT gate. In still another case, the determining unit 24 may be implemented as an XOR gate, one input terminal of the XOR gate receives the original clock signal and the other input of the XOR gate receives the triggering signal from the D trigger. Thus, the XOR gate makes an XOR operation to the triggering signal and the original clock signal and outputs the operation result as the final clock signal. Additionally, it should be noted that the NOT gate 305 and 307, the NAND gate 306, and the NOR gate may be replaced by other logic circuit being capable of implementing same functions.

The operation principle of the comparator shown in FIG. 3 is described hereafter with the low voltage level (L) as the idle voltage level and the high voltage level (L) as the busy voltage level.

When the original clock signal is L, the NOT gate 303 outputs H to the clearing terminal of the D trigger 302 so that the D trigger 302 output the L to one input terminal of the NOR gate 305 as the triggering signal. Simultaneously, the NOT gate 307 outputs H to other input terminal of the NOR gate 305. Thus, the NOR gate 305 outputs L to one input terminal of the NAND gate 306, the other input terminal of the NOR gate 306 receives L of the original clock signal, so the NAND gate 306 output H to the NOT gate 304. Subsequently, the NOT gate 304 outputs L as the final clock signal of the comparator unit 23. Hence, the comparator unit 23 comes into the idle state with the output signals VOS and VOR both being L. Then, the XOR gate 301 output L as the detecting signal because the output signals VOS and VOR are identical. As a result, the D trigger 302 remains to output L so that the comparator unit 21 may keep the idle state by cycling above operations until H is inputted as the original clock signal from the clock control unit 25.

When the original clock signal is H, the NOT gate 303 outputs L to the clearing terminal of the D trigger 302 but the D trigger 302 still output L to one input terminal of the NOR gate 305 as the triggering signal. Simultaneously, the NOT gate 307 outputs L to other input terminal of the NOR gate 305. Thus, the NOR gate 305 outputs H to one input terminal of the NAND gate 306, the other input terminal of the NOR gate 306 receives the original clock signal H, so the NAND gate 306 output L to the NOT gate 304 so that the NOT gate 304 outputs H as the final clock signal of the comparator unit 23. Thus, the comparator unit 23 turns into the busy state. At the busy state, the comparator unit 23 compares the input signal VIP with the input signal VIN and determines the values of the output signals VOR and VOS depending on the comparing result, e.g., the output signal VOR is H and the output signal VOS is L or the output signal VOR is L and the output signal VOS is H. Subsequently, the XOR 301 outputs H to the D trigger because the output signals VOS and VOR are different. At this time, the D trigger turns to output the H to the NOR gate 305. Thus, the NOR gate 305 outputs H to the NAND gate 306 because the other input terminal thereof is not changed. Correspondingly, the NAND gate 306 output L to the NOT gate 304 so that the NOT gate 304 outputs L as the final clock signal of the comparator unit 23. Finally, the comparator unit 23 turns into the idle state again with the output signal VOR being identical with the output signal VOS. At this time, the XOR 301 outputs L so that the triggering unit 23 keeps the original state to output H. As a result, the comparator unit 21 may keep the idle state by cycling above operations until another busy voltage level pulse is inputted from the clock control unit 25.

It can be observed that the comparator according to the present invention isn't always in the busy state any more if the original clock signal is the busy voltage level all the time. As an improvement, the comparator according to the present invention comes into the idle state right now once the comparing result is generated so that the power consumption thereof is maximally reduced.

FIG. 4 is a schematic flowchart showing a method for reducing power consumption of the comparator according to one embodiment of the present invention. In FIG. 4, the method comprises following operations.

At 401, the comparator compares the input signal VIP and the input signal VIN according to the final clock signal and output the output signal VOR and the output signal VOS. In operation, if the final clock signal is the idle voltage level signal, the comparator output the identical output signals VOR and VOS; otherwise, the comparator determines the values of the output signals VOR and VOS depending on the comparing result, one is the idle voltage level and the other is the busy voltage level. The values of the output signals VOR and VOS are latched in a storage unit such as a register, subsequently.

At 402, the detecting unit detects whether the output signals VOR and VOS are identical. If yes, the idle voltage level is outputted as the detecting signal; otherwise, the busy voltage level is outputted as the detecting signal.

At 403, the triggering signal is generated according to the detecting signal and the original clock signal. In operation, if the original clock signal is the idle voltage level, the triggering signal is the idle voltage level too; otherwise, else if the detecting signal is the idle voltage level, the triggering signal remains the original state thereof, otherwise, the triggering signal turns to the opposite state thereof.

At 404, the final clock signal is generated by detecting whether the triggering signal is identical with the original clock signal. In operation, if yes, the final clock signal is the idle voltage level; otherwise, the final clock signal is the busy voltage level. The process is returned to 401 subsequently.

As a result, the comparator according to the present invention comes into the idle state right now once the comparing result is generated so that the power consumption thereof is maximally reduced.

The present invention has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the foregoing description of embodiments.

What is claimed is:

1. A comparator unit with reduced power consumption, the comparator unit configured to compare a pair of input signals thereof to generate a pair of output signals under a control of a final clock signal, the values of the output signals being identical when the final clock signal is an idle voltage level while the values of the output signals being different when the final clock signal is a busy voltage level, the comparator comprising:
    a detecting unit configured to detect whether the values of the output signals of the comparator are identical, the detecting unit generating the idle voltage level as a detecting signal when the values of the output signals of the comparator are identical, otherwise, the detecting unit generating the busy voltage level as the detecting signal;
    a triggering unit configured to generate a triggering signal depending on the detecting signal and an original clock signal for controlling the comparator, the triggering unit generating the idle voltage level as the triggering signal as long as the original clock signal is the idle voltage level, the triggering signal remaining an original state thereof when the detecting signal is the idle voltage level and the original clock signal is the busy voltage level, and the triggering signal turning to an opposite state thereof when the detecting signal is the busy voltage level and the original clock signal is the busy voltage level; and
    a determining unit configured for generating the final clock signal for the comparator depending on the triggering signal and the original clock signal, the determining unit generating the busy voltage level as the final clock signal when the triggering signal is different from the original clock signal and generating the idle voltage level as the final clock signal when the triggering signal is identical with the original clock signal.

2. The comparator according to claim 1, wherein the triggering unit comprises a D trigger and a NOT gate, the original clock signal is leaded to an input terminal of the NOT gate and an output terminal of the NOT gate electrically connects with a clear terminal of the D trigger, a clock signal terminal of the D trigger electrically connects with an output terminal of the detecting unit for receiving the detecting signal; and the trigger signal is outputted to the determining unit via an output signal terminal QP of the D trigger.

3. The comparator according to claim 1, wherein one of the detecting unit and determining unit is an XOR gate.

4. The comparator according to claim 1, wherein a high voltage level serves as the busy voltage level and a low voltage level serves as the idle voltage level.

5. The comparator according to claim 1, wherein the determining unit comprises first and second NOT gates, a NOR gate and a NAND gate,
    the first NOT gate has an input terminal for receiving the original clock signal and an output terminal;
    the NOR gate has an output terminal and a pair of input terminals one receiving the triggering signal from the triggering unit and the other electrically connecting with the output terminal of the first NOT gate;
    the NAND gate has an output terminal and a pair of input terminals one receiving the original clock signal and the other electrically connecting with the output terminal of the NOR gate;
    the second NOT gate has an input terminal electrically connecting with the output terminal of the NAND gate and an output terminal for outputting the clock signal for the comparator.

6. A comparator with reduced power consumption, the comparator configured to compare a pair of input signals thereof to generate a pair of output signals, the output signals being identical in an idle state of the comparator and the output signals being different in an busy state of the comparator, the comparator, controlled by a final clock signal, comprising:
    an integrated circuit configured for turning the comparator into the idle state after the comparator generates the output signals in the busy state, wherein the integrated circuit is a feedback loop including a detecting unit, a triggering unit and a determining unit, and wherein
    the detecting unit designed to detect whether the output signals are identical, the detecting unit generating an idle voltage as a detecting signal when the output signals are identical, otherwise, the detecting unit generating a busy voltage level as the detecting signal;
    the triggering unit configured to generate the triggering signal depending on the detecting signal and an original clock signal for controlling the comparator, the triggering unit generating the idle voltage level as the triggering signal as long as the original clock signal is the idle voltage level, the triggering signal remaining an original state thereof when the detecting signal is the idle voltage level and the original clock signal is the busy voltage level, and the triggering signal turning to an opposite state thereof when the detecting signal is the busy voltage level and the original clock signal is the busy voltage level; and
    the determining unit configured for generating the final clock signal for the comparator depending on the triggering signal and the original clock signal, the determining unit generating the busy voltage level as the final clock signal when the triggering signal is different from the original clock signal and generating the idle voltage level as the final clock signal when the triggering signal is identical with the original clock signal.

7. The comparator according to claim 6, wherein the integrated circuit configured further for turning the comparator from the idle state into the busy state after receiving one busy clock signal for controlling the comparator, and then turning the comparator from the busy state into the idle state after the comparator generates the output signals in the busy state until next one busy clock signal is received.

* * * * *